United States Patent [19]

Crouch

[11] 4,351,992

[45] Sep. 28, 1982

[54] HIGH-POTENTIAL TESTING OF VACUUM-TYPE CIRCUIT INTERRUPTERS

[75] Inventor: Donald W. Crouch, Newtown Square, Pa.

[73] Assignee: General Electric Company, Philadelphia, Pa.

[21] Appl. No.: 91,027

[22] Filed: Nov. 5, 1979

[51] Int. Cl.³ ............................................ H01H 33/66
[52] U.S. Cl. .................................................. 200/144 B
[58] Field of Search ...................................... 200/144 B

[56] References Cited

U.S. PATENT DOCUMENTS

| 3,038,980 | 6/1962 | Lee | 200/144 B |
|---|---|---|---|
| 3,263,162 | 7/1966 | Lucek et al. | 200/144 B |
| 3,403,297 | 9/1968 | Crouch | 200/144 B |
| 3,508,021 | 4/1970 | Bellis | 200/144 B |
| 3,668,350 | 6/1972 | Takeuchi et al. | 200/144 B |
| 4,039,792 | 8/1977 | Crouch et al. | 200/144 B |
| 4,096,366 | 6/1978 | Titus | 200/144 B |
| 4,103,291 | 7/1978 | Howe et al. | 200/144 B |
| 4,163,130 | 7/1979 | Kubota et al. | 200/144 B |

FOREIGN PATENT DOCUMENTS 2002685 3/1971 Fed. Rep. of Germany ... 200/144 B

Primary Examiner—Robert S. Macon
Attorney, Agent, or Firm—William Freedman

[57] ABSTRACT

This method assures that when a vacuum interrupter having its interior at atmospheric pressure is tested by a high potential applied across its contacts, a spark-over will occur internally of the interrupter even though the high potential used has a lower effective value than the minimum needed to consistently produce a spark-over between the fully-separated contacts of the interrupter when the interrupter is at atmospheric pressure. Spaced metallic parts are provided within the interrupter, and these parts are of a metal characterized by higher dielectric strength in a vacuum than the metal used for the opposing regions of the contacts. The minimum gap between the spaced metallic parts is made shorter than the gap between the fully-separated contacts of the interrupter but yet is sufficiently long so that under normal vacuum conditions, it is less susceptible to spark-over than the gap between the fully-separated contacts.

5 Claims, 1 Drawing Figure

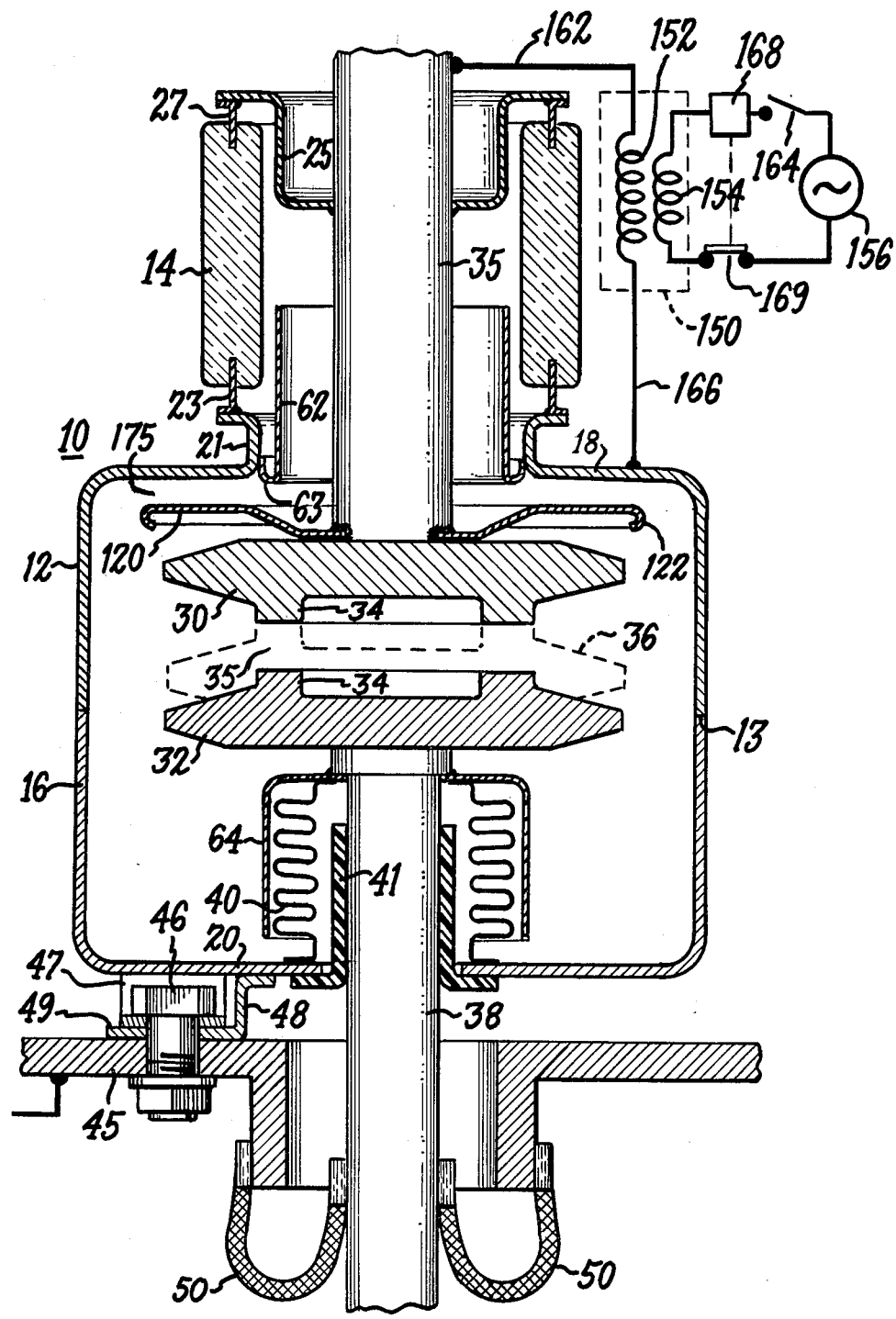

HIGH-POTENTIAL TESTING OF VACUUM-TYPE CIRCUIT INTERRUPTERS

BACKGROUND

This invention relates to high-potential testing of vacuum-type circuit interrupters to determine whether the pressure therein has risen to abnormal levels and, more particularly, relates to this type of testing as applied to a vacuum interrupter that is susceptible to external spark-overs when subjected to high potentials applied between its fully-separated contacts of an effective value equal or greater than a predetermined minimum value sufficient to consistently produce a spark-over between said fully-separated contacts when said interrupter is at atmospheric pressure.

The usual vacuum-type circuit interrupter comprises a highly-evacuated envelope within which there is located a pair of separable contacts. When the contacts are separated during an interrupting operation, an arc is drawn between them; and this arc persists until a natural current zero, at which time it is prevented from reigniting by the high dielectric strength of the vacuum. For the interrupter to function properly, the normal pressure within the envelope must be below a predetermined maximum level.

A conventional way of testing the interrupter to determine whether the pressure therein has risen to an abnormal level is to apply between its fully-separated contacts a high potential which has a sufficient effective value to consistently produce a spark-over between the contacts if the pressure therein has risen to an abnormal value. Such a pressure rise might have resulted from a leak in the envelope of the interrupter. This conventional test method works quite well if the vacuum interrupter has a high voltage rating and thus has sufficient external dielectric strength to prevent an external spark-over when this potential is applied. But if the interrupter has a relatively low voltage rating and, consequently, considerably less external dielectric strength, application of the above-described high potential may very well produce an external spark-over. This is particularly so if the normal external dielectric strength has been reduced as a result of high humidity or contamination or a combination of these two conditions.

If the person testing the interrupter was not aware that the spark-over was an external one, he might be misled into thinking that the vacuum within the interrupter had been lost, and he might therefore erroneously replace and perhaps even discard the interrupter even though it was perfectly good. Even if he was aware that the spark-over was an external one, he would be frustrated in continuing with the test because of such external spark-overs.

A possible way of alleviating this problem is to use a lower value of high potential for testing the interrupter. This may be satisfactory if the pressure within the interrupter has risen only slightly from its normal range, for example, to the glow level. But if the pressure has risen to atmospheric, or to the neighborhood of atmospheric, this low level of high potential might not be sufficient to produce a spark-over between the contacts due to the higher dielectric strength within the interrupter.

SUMMARY

Accordingly, an object of my invention is to assure that even though the pressure within the interrupter has risen to atmospheric, an internal spark-over will occur even though the test voltage applied is lower than the predetermined minimum value needed to consistently produce a spark-over between the fully-separated contacts when the interrupter is at atmospheric pressure.

Another object is to provide within the interrupter, means which, though capable of sparking-over at atmospheric pressure in response to the high potential of the preceding object, is nevertheless no more, or even less, susceptible to spark-over than the gap between the contacts when normal vacuum is present within the interrupter.

In carrying out my invention in one form, I provide a method of assuring that a spark-over will occur internally of the interrupter, when at atmospheric pressure, even though the voltage used for testing has an effective value lower than the predetermined minimum value referred to hereinabove in the first object. This method comprises: (a) providing within the interrupter spaced-apart metallic parts across which appears any potential applied between the fully-separated contacts, (b) utilizing for the opposing regions of said metallic parts one or more metals that in a vacuum are characterized by higher dielectric strength than the metal or metals used for the opposing regions of said contacts, and (c) providing a gap between said metallic parts that is of such length and configuration that it is subjected to substantially higher maximum voltage stresses than the gap between the fully-separated contacts when a high potential is applied across said latter gap. In addition, the gap between said metallic parts is made sufficiently short that when at atmospheric pressure it will spark-over at high potentials having an effective value substantially lower than said predetermined minimum value.

BRIEF DESCRIPTION OF DRAWING

For a better understanding of the invention, reference may be had to the following description taken in connection with the accompanying drawing where the single FIGURE is a cross-sectional view of a vacuum interrupter prepared in accordance with one form of the invention for high potential testing.

DETAILED DESCRIPTION OF PREFERRED EMBODIMENT

Referring now to FIG. 1, there is shown a vacuum circuit interrupter of the general type disclosed and claimed in U.S. Pat. No. 4,039,792-Crouch et al. This previous patent is incorporated by reference in the present application, and wherever possible the present application will use the same reference numerals as used in the previous patent to designate corresponding parts.

The interrupter of the FIGURE comprises a highly evacuated envelope 10 having a normal interior pressure of $10^{-4}$ torr or lower. This envelope 10 comprises a metal housing 12 and a tubular insulator 14, preferably of glass, at one end of the metal housing. The metal housing comprises a generally cylindrical portion 16 and a pair of integrally formed end flanges 18 and 20 at its opposite ends extending radially inward from the cylindrical portion. In a preferred embodiment the metal housing 12 is of stainless steel.

The upper end flange 18 has a portion 21 at its radially inner end that is joined in vacuum-tight relation to a tubular end fitting 23 in the lower end of insulator 14. At the upper end of insulator 14 there is an inwardly dished metal end cap 25 that is brazed to a tubular end fitting 27 in the upper end of insulator 14. The two end fittings 23 and 27 are imbedded in the glass insulator 14 to provide conventional glass-to-metal seals.

Within the metal housing 12 are two relatively movable disc-shaped contacts 30 and 32 each having a centrally-located, annular arc-initiating portion 34. Upper contact 30 is a generally stationary contact mounted on a generally stationary conductive contact rod 35, which is fixed to contact 30 generally centrally thereof. Lower contact 32 is a movable contact mounted on an axially-movable contact rod 38, which is fixed to contact 32 generally centrally thereof. The interrupter is depicted in solid lines in its fully-open position. In this position the contacts 30 and 32 are separated by an inter-contact gap 35. Closing of the interrupter is effected by driving the lower contact upwardly into its dotted-line position 36, where it engages the upper contact 30 along the annular arc-initiating regions 34. When the interrupter is closed, current flows through the contacts via their arc-initiation regions.

Stationary contact rod 35 extends through insulator 14 in radially-spaced coaxial relationship thereto. The upper end cap 25 has a central opening through which stationary contact rod 35 extends, and a suitable brazed joint provides a vacuum-tight connection between end cap 25 and contact rod 35.

The movable contact rod 38 extends freely through a central opening in the lower end flange 20 of metal housing 12. A flexible metallic bellows 40 provides a vacuum-tight seal between the end flange 20 and contact rod 38 that allows contact rod 38 to be moved axially through an opening or closing stroke of the interrupter without impairing the vacuum within envelope 10. This bellows 40 is located within the cylindrical portion 16 of metal housing 12 and has its lower end joined to flange 20 and its upper end joined to contact rod 38. A suitable sleeve bearing 41 mounted on the end flange 20 exteriorly of the envelope 10 fits within bellows 40 to guide the movable contact rod 38 for substantially straight-line motion during its opening and closing strokes.

The envelope 10 is fixed to a conductive bus 45, preferably of copper, located adjacent its lower end. In the illustrated embodiment, this mechanical connection is effected through a series of U-shaped brackets 47, the legs of which are brazed to the lower end flange 20, as shown in FIG. 2 of the aforesaid U.S. Pat. No. 4,039,792. A plurality of such brackets (only one of which is shown) are located in circumferentially-spaced positions about the end flange 20. Each of these brackets is bolted to the bus 45 by suitable bolts 46 clamping the bracket to the bus. To provide a high conductivity electrical connection between the end flange 20 and the bus 45, a tab 48 of a high conductivity metal such as copper is brazed to the end flange 20 and has an extension 49 that is clamped between the bottom of bracket 47 and the top of copper bus 45.

Bus 45 is also electrically connected to the movable contact rod 38. In the illustrated embodiment, this connection is effected by means of a plurality of flexible metal braids 50, each having one end connected to bus 45 and its other end connected to contact rod 38. When the circuit interrupter is in its closed position, current flows therethrough via the braids 50, following a path that extends through bus 45, braids 50, and parts 38, 32, 30, and 35 in series.

Circuit-interruption is initiated by driving the contact rod 38 in a downward direction to separate contacts 30 and 32. This initiates an arc between the annular arc-initiating portions 34 of the contacts. This arc is driven in a radially outward direction by the magnetic effect of current flowing through the loop-shaped path through the contacts. As the arc moves radially outward, it is caused to revolve circumferentially of the contacts. This arc-revolving effect is produced by a series of circumferentially-spaced slots in each contact dividing the contact into a plurality of circumferentially-spaced fingers, as best shown in FIG. 3 of the aforesaid U.S. Pat. No. 4,039,792 and in my U.S. Pat. No. 3,809,836.

For condensing the metal vapors generated by arcing, I rely primarily upon the metal housing 12 to act as a vapor-condensing shield. Most of the metal vapors generated by arcing between the contacts are expelled radially outward from the inter-contact gap and are intercepted and condensed by the cylindrical portion 16 of the metal housing. A minor percentage of the metal arcing products are discharged axially of the contacts, through the arc-revolving slots in the contacts. Most of the metal vapors discharged axially of the contacts through the slots in upper contact 30 are intercepted and condensed by an auxiliary shield 120 located immediately above the upper contact 30.

In a preferred embodiment of the invention, this auxiliary shield 120 is a disc-shaped member of stainless steel. The disc-shaped shield 120 has a central opening surrounding the upper contact rod 35, and its inner periphery is suitably brazed between the lower end of contact rod 35 and the upper contact 30. Shield 120 is dished in its central region so that its outer peripheral region is axially spaced from the stationary contact 30. The outer periphery of shield 120 is curled over at 122 so as to eliminate a sharp edge in this region, thus reducing electric stresses in this region. The curl 122 also helps to prevent warping of the thin sheet metal shield, thereby keeping the length of gap 175 (to be described) essentially unchanged.

As pointed out hereinabove, for the interrupter to function properly, the normal pressure within the envelope 10 must be below a predetermined maximum level. A conventional way of testing the interrupter to determine whether the pressure within the envelope has risen to an abnormal level is to apply between its fully-separated contacts a high potential which has a sufficient effective value to consistently produce a breakdown, or spark-over, between the contacts if the pressure therein has risen to atmospheric pressure.

A source for applying such a high potential is shown at 150 in the FIGURE. This source comprises a step-up transformer having a secondary winding 152 and a primary winding 154. One terminal of the secondary winding 152 is connected through a lead 162 to the upper contact rod 35, and the opposite terminal of the secondary winding 152 is connected through lead 166 to the metal housing 12. The primary winding 154 is connected across a suitable low voltage ac source 156. In series with the primary winding 154 is a potential-applying switch 164 and current-responsive means 168 which controls a set of normally-closed contacts 169 also in series with the primary winding 154. When switch 164 is operated to closed position, the primary winding 154 is energized, and the resulting high potential appearing across secondary winding 152 is applied between contact rod 35 and housing 12. Should there be a spark-over within the interrupter while this high potential is applied, the current-responsive means 168 will quickly respond, opening the contacts 169 to deenergize the primary winding and turning on a suitable indicating light (not shown).

Assuming that the interrupter is in its fully-open position when the potential-applying switch 164 is closed, the voltage that appears across the terminals of the high potential source 150 is applied across the fully-separated contacts of the interrupter. A typical voltage that has hereinbefore been used for this high potential test is a 60 hertz voltage having an rms value in the range of 30 to 35 kV. If the pressure within the interrupter is at its normal level, this voltage will produce no spark-over internally of the interrupter, and this fact will be apparent from the absence of an indicating signal from the current-responsive means 168.

Assuming that the interrupter has no auxiliary shield 120, and thus corresponds to the interrupter shown in FIG. 1 of the aforesaid U.S. Pat. No. 4,039,792, and assuming further that the internal pressure within the envelope 10 has risen to atmospheric pressure due to a leak, then when the above-described high potential of 30 to 35 kV is applied across the interrupter's fully-separated contacts 30, 32, a spark-over would occur between the contacts. The occurrence of such a spark-over would be apparent from the signal produced by current-responsive means 168, thus indicating to the tester that abnormal pressure exists within the interrupter envelope 10.

This conventional test method works quite well with the above-referred-to prior art vacuum interrupter if the interrupter has sufficient external dielectric strength to prevent an external spark-over when the above-described high potential is applied. But if the interrupter has a relatively low voltage rating and if its normal external dielectric strength has been reduced as a result of high humidity and/or contamination on the exterior of insulator 14, there is a significant chance that the high potential used for testing will produce an external spark-over along the exterior of the insulator. Such a spark-over will appear to the current responsive means 168 essentially the same as a spark-over between the contacts 30 and 32.

If the person testing the interrupter observed the indicating light turned on by the current-responsive means 168 but was not aware that the spark-over was an external one, he might be misled into thinking that the vacuum inside the interrupter had been lost. This might cause him to erroneously replace the interrupter even though it was perfectly good. Even if he was aware that the spark-over was an external one, he would be frustrated in continuing with the test because of such external spark-over, which would interfere with applying the desired high potential across the inter-contact gap.

As pointed out hereinabove a possible way of alleviating this problem is to use a lower value of high potential for testing the interrupter. This may be satisfactory if the pressure within the interrupter has risen only slightly from its normal range, for example, to the glow level, where its internal dielectric strength would be near a minimum. But if the pressure has risen to atmospheric, or to the neighborhood of atmospheric, this low level of high potential might not be sufficient to produce a spark-over between the contacts due to the higher dielectric strength then present within the interrupter.

As pointed out hereinabove, an object of my invention is to assure that even though the pressure within the interrupter has risen to atmospheric, an internal spark-over will occur even though the voltage applied is lower then the minimum value needed to consistently produce a spark-over between the fully-separated contacts.

I attain this object by: (1) providing between the auxiliary shield 120 and the flange 18 of the housing 12 a gap 175 that is subjected to substantially higher maximum voltage stresses than the gap between the fully-separated contacts when the above-described high potential is applied across the latter gap and (2) making the parts 120 and 18 of a metal that has higher dielectric strength properties in vacuum than the metal of the contacts 30 and 32.

In a preferred embodiment of the invention, I locate the auxiliary shield 120 so that the gap 175 has a minimum length of 11/32 inch as compared to a gap of ½ inch between the arc-initiating regions 34 of the fully-separated contacts 30 and 32. The relatively short length of gap 175 as compared to that between the fully-separated contacts results in substantially higher maximum voltage stresses in gap 175 than are present in the latter gap. Also in this preferred embodiment, I utilize stainless steel as the material of the shield 120 and of the housing 12, including the flange 18; and I utilize for the arc-initiating regions 34 of the contacts a copper-base material, preferably 99.5% copper and 0.5% bismuth. This latter material, which is now a conventional contact material for vacuum interrupters, is more fully described and claimed in U.S. Pat. No. 3,246,979—Lafferty et al., assigned to the assignee of the present invention.

When normal vacuum is present in the interrupter, the spark-over voltage of the gaps in the interrupter is heavily dependent upon the material of the confronting faces of the spaced electrodes defining the gaps. As pointed out in U.S. Pat. No. 3,038,980—Lee, the property of a metal that appears to be the most predominant in determining spark-over voltage of a vacuum gap between electrodes of such metal is the metal's modulus of elasticity in tension, i.e., Young's modulus. The highly refractory metals such as tungsten and molybdenum have very high values of Young's modulus, e.g., 50 to $60 \times 10^6$ psi. For nickel, iron and most steels, the Young's modulus is about $29 \times 10^6$ psi. Copper has a Young's modulus of about $16 \times 10^6$ psi. Aluminum has a Young's modulus of about $10 \times 10^6$ psi. Static and impulse breakdown tests run with electrodes of these materials in a vacuum have shown that, in general, the spark-over, or breakdown voltage is highest for the metals with the highest Young's modulus, is lowest for the metals with lowest Young's modulus, and is in an intermediate range for the metals having intermediate values of Young's modulus. In the disclosed embodiment of the invention, the shield 120 and housing 12 are made of a material, stainless steel, having a higher Young's modulus than the material of the arc-initiation regions 34 of the contacts, i.e., the copper-base material used for these regions. Accordingly, a vacuum gap with electrodes of stainless steel is able to withstand substantially higher voltages than an otherwise identical vacuum gap having electrodes of copper or the copper-base material used for regions 34. Because these parts 120 and 18 are made of a material with a relatively high dielectric strength in vacuum, I am able to make the gap 175 between them relatively short. Even though this gap is shorter than the inter-contact gap, there is no significant risk of its sparking-over to interfere with the performance of the interrupter during normal operation since a high internal vacuum is present during normal operations and the gap 175 is able to withstand high voltages because of the high Young's modulus of the stainless steel electrode surfaces bounding the gap 175.

When the pressure in the interrupter rises to the neighborhood of atmospheric, the dielectric strength of the internal gaps is no longer governed primarily by the material of the electrodes. Under these pressure conditions, the major determinant of dielectric strength is the maximum voltage stress in the gap, and this is determined primarily by the length of the gap and its configuration. I have taken advantage of this characteristic by making the length of gap 175 sufficiently short so that when the pressure rises to atmospheric, the gap 175, being substantially more highly stressed than the inter-contact gap is more susceptible to spark-over than the inter-contact gap. As noted hereinabove, the gap 175 has a minimum length of 11/32 inch as compared to ½ inch for the inter-contact gap. The maximum voltage stress in the gap 175 is approximately 150% that in the gap between the fully-separated contacts.

In a preferred embodiment of the invention, I have made the gap 175 so short that a high potential test voltage of 20 kV can be used instead of the 30–35 kV referred to hereinabove. This voltage is high enough to spark-over the gap 175 should atmospheric pressure be present in the interrupter and yet is sufficiently low that it will cause no significant external spark-over problems. It is noted that the same voltage appears across the gap 175 as appears across the inter-contact gap inasmuch as the housing 12 of the interrupter is electrically connected to the lower contact 32 and the shield 120 is electrically connected to the upper contact 30.

Although I have shown test voltage leads 162 and 166 connected directly to parts of the interrupter itself, it will be apparent that they could instead be connected to relatively remote, but more accessible, components of the switchgear assembly (not shown) in which the interrupter is connected, assuming, of course, that one lead is attached to a component electrically connected to one contact 30 and the other lead is connected to a component electrically connected to the other contact 32. Using a relatively low test voltage enables me to apply the test voltage in this manner without significant likelihood of producing a misleading spark-over elsewhere in the switchgear assembly when testing for vacuum in the interrupter.

Although I have described the test source as being a source of alternating voltage, it is to be understood that it could equally well be a source of direct voltage producing a d-c voltage of the same value as the peak value of a corresponding a-c source.

While I have shown and described a particular embodiment of my invention, it will be obvious to those skilled in the art that various changes and modifications may be made without departing from my invention in its broader aspects; and I, therefore, intend herein to cover all such changes and modifications as fall within the true spirit and scope of my invention.

What I claim as new is:

1. For use with a vacuum-type circuit interrupter that has a relatively low voltage rating and (i) comprises a pair of separable contacts that are fully separated when the interrupter is opened, (ii) further comprises an envelope having an interior that is normally at a vacuum, the envelope comprising a metal housing electrically connected to one contact and surrounding said pair of contacts and an insulator at one end of the metal housing electrically isolating the other of said contacts from said metal housing, and (iii) is susceptible to external spark-over across said insulator when subjected to high potentials applied between its fully-separated contacts of an effective value equal to a predetermined minimum value sufficient to consistently produce a spark-over between said fully-separated contacts when the space within said interrupter is at atmospheric pressure; a method of assuring, during testing for loss-of-vacuum with high potential higher than normal operating voltage, that a spark-over will occur internally of said interrupter envelope when subjected to high potentials having an effective value substantially lower than said predetermined minimum value when said interrupter space is at atmospheric pressure, comprising:
   (a) providing within said interrupter envelope two spaced-apart metallic parts across which appears a potential equal to that applied between said fully-separated contacts, one of said metallic parts being a shield electrically connected to said other contact and extending alongside said metallic housing in spaced relationship thereto, the other of said metallic parts being a portion of said metallic housing located adjacent said shield,
   (b) utilizing for the opposing regions of said metallic parts one or more metals that in a vacuum are characterized by higher dielectric strength than the metal or metals used for the opposing regions of said contacts, and
   (c) providing a gap between the opposing regions of said metallic parts that is of such length and configuration that it is subjected to substantially higher maximum voltage stresses than the gap between said fully-separated contacts when a high potential is applied across the gap between said fully-separated contacts,
   (d) said gap between said metallic parts having: (i) a length sufficiently short that when at atmospheric pressure it will spark-over at high potentials having an effective value substantially lower than said predetermined minimum value and (ii) a minimum length shorter than the gap between said fully-separated contacts.

2. The method of claim 1 in which the metal utilized for the opposing regions of said parts is stainless steel and the metal used for the opposing regions of said contacts is a copper base metal.

3. The method of claim 1 in which the metal utilized for the opposing regions of said parts has a higher Young's modulus than the metal used for the opposing regions of said contacts.

4. The method of claim 1 in which the gap provided between the opposing regions of said metallic ports is sufficiently long that under normal vacuum conditions the gap between said fully-separated contacts is more susceptible to spark-over than the gap between said metallic parts.

5. The method of claim 2 in which the gap provided between the opposing regions of said metallic parts is sufficiently long that under normal vacuum conditions the gap between said fully-separated contacts is more susceptible to spark-over than the gap between said metallic parts.

* * * * *